US007864088B2

(12) United States Patent
Teo et al.

(10) Patent No.: US 7,864,088 B2
(45) Date of Patent: Jan. 4, 2011

(54) INTEGRATED DSP FOR A DC OFFSET CANCELLATION LOOP

(75) Inventors: Swee Ann Teo, Shanghai (CN); Shunfang Wu, Shanghai (CN)

(73) Assignee: Montage Technology Group Ltd., George Town, Grand Cayman (KY)

( * ) Notice: Subject to any disclaimer, the term of this patent is extended or adjusted under 35 U.S.C. 154(b) by 427 days.

(21) Appl. No.: 11/342,256

(22) Filed: Jan. 27, 2006

(65) Prior Publication Data
US 2007/0216562 A1 Sep. 20, 2007

(51) Int. Cl.
*H03M 1/06* (2006.01)

(52) U.S. Cl. .................. 341/118; 341/155; 341/144

(58) Field of Classification Search ............... 341/144, 341/155, 118, 120, 143
See application file for complete search history.

(56) References Cited

U.S. PATENT DOCUMENTS

| | | | | |
|---|---|---|---|---|
| 5,442,172 A * | 8/1995 | Chiang et al. | ......... | 250/237 G |
| 5,909,333 A * | 6/1999 | Best et al. | ......... | 360/51 |
| 6,191,648 B1 * | 2/2001 | Lewicki | ......... | 327/554 |
| 6,441,767 B1 * | 8/2002 | Frazier | ......... | 341/155 |
| 6,891,490 B2 * | 5/2005 | Hales | ......... | 341/155 |
| 7,053,705 B2 * | 5/2006 | Hench et al. | ......... | 330/102 |
| 7,394,869 B2 * | 7/2008 | Jensen et al. | ......... | 375/302 |
| 2004/0106380 A1 * | 6/2004 | Vassiliou et al. | ......... | 455/73 |

FOREIGN PATENT DOCUMENTS

WO PCT/US00/14721 12/2000

OTHER PUBLICATIONS

Christopher Dennis Hull, Joo Leong Tham, et al., "A Direct-Conversion Receiver for 900 MHz (ISM Band) Spread-Spectrum Digital Cordless Telephone", IEEE Journal of Solid-State Circuits, vol. 31, No. 12, Dec. 1996.
Behzad Razavi, "A 2.4-GHz CMOS Receiver for IEEE 802.11 Wireless LAN's", IEEE Journal of Solid-State Circuits, vol. 34, No. 10, Oct. 1999.
Ramesh Harjani, Jonghae Kim, and Jackson Harvey, "DC-Coupled IF Stage Design for a 900-MHz ISM Receiver", IEEE Journal of Solid-State Circuits, vol. 38, No. 1, Jan. 2003.
Francesco Gatta, Danilo Manstretta, et al., "A Fully Integrated 0.18-mm CMOS Direct Conversion Receiver Front-End With On-Chip LO for UMTS", IEEE Journal of Solid-State Circuits, vol. 39, No. 1, Jan. 2004.
Sining Zhou and Mau-Chung Frank Chang, "A CMOS Passive Mixer With Low Flicker Noise for Low-Power Direct-Conversion Receiver", IEEE Journal of Solid-State Circuits, vol. 40, No. 5, May 2005.

* cited by examiner

*Primary Examiner*—Peguy JeanPierre
(74) *Attorney, Agent, or Firm*—Ivy Mei (57) ABSTRACT

Processes and apparatuses for direct current (DC) offset cancellation using digital signal processing. Some embodiments of the invention are summarized in this section. In one embodiment, a circuit includes: an analog receiver; and a feedback circuit comprising a digital signal processor coupled with the analog receiver to generate a feedback signal to the analog receiver.

10 Claims, 7 Drawing Sheets

INTEGRATED DSP FOR A DC OFFSET CANCELLATION LOOP

FIELD OF THE TECHNOLOGY

At least some embodiments of the invention relate to direct current (DC) offset cancellation.

BACKGROUND

A receiver can mix a local reference signal with an input signal to generate an output signal at an intermediate frequency (IF), which is defined as the difference between the frequency of the input signal and the input of the local reference signal. A direct conversion receiver (DCR) synchronizes the frequency of the local reference signal with the frequency of the carrier of the input signal so that the mixer produces a zero intermediate frequency (IF) output. Thus, a direct conversion receiver may also be called a zero-IF receiver, or Synchrodyne, or Homodyne.

When a direct conversion receiver is used, the signal modulated on the desired carrier is directly demodulated. Signals modulated on other carriers can be removed with a low-pass filter that blocks the signals at the frequencies of other carriers and the frequency of the local reference signal. The receiver has high selectivity and is a precision demodulator.

A direct conversion receiver can be used to receive radio signals, such as in the applications of cell phones, televisions, avionics and medical imaging apparatus.

A direct conversion receiver may have a direct current (DC) offset problem. A reverse transmission path may occur in a direct conversion receiver. Local oscillator energy can leak through the mixer to the input and then re-enter the mixer, causing the local oscillator energy to self-mix and create a DC offset. The offset might become large enough to saturate the base band amplifiers and degrade the reception of the signals demodulated from the desired carrier.

If the direct current (DC) offset is not well suppressed, it can decrease the receiver sensitivity. A traditional solution uses a circuitry which requires a large capacitor (e.g., above 10 nH) for DC offset compensation. The size of the capacitance as required by the traditional analog circuitry is so large that such a capacitor is implemented as a discrete component.

The need of external components increases the board space and the cost of the system. Further, the external capacitor may pick up noise. For example, Ramesh Harjani, et al., describes an analog feedback circuitry to suppress the direct current (DC) offset, in "DC-Coupled IF Stage Design for a 900-MHz ISM Receiver, IEEE J Solid-State Circuits, V. 38, No. 1, pp. 126-134, 2003, which requires an external integration capacitor to detect the direct current (DC) offset.

SUMMARY OF THE DESCRIPTION

Processes and apparatuses for direct current (DC) offset cancellation using digital signal processing are described herein. Some embodiments of the invention are summarized in this section. In one embodiment, a circuit includes an analog receiver; and a feedback circuit comprising a digital signal processor coupled with the analog receiver to generate a feedback signal to the analog receiver.

The feedback circuit further includes an analog-to-digital converter coupled with the analog receiver to digitize an analog signal of the analog receiver; and a digital-to-analog converter coupled with the analog receiver to provide the feedback signal to the analog receiver. The digital-to-analog converter includes a sigma delta digital-to-analog converter. The digital signal processor includes a digital accumulator; and the feedback signal reduces a direct current (DC) offset in the analog receiver.

The digital accumulator includes an adder; a delay element coupled to an output of the adder; and a digital loop filter coupled from an output of the delay element to an input of the adder.

In one embodiment of the invention, the digital accumulator further includes a gain controller coupled with the adder.

The feedback circuit further includes a low pass filter coupled with the digital-to-analog converter to generate the feedback signal. The low pass filter is implemented using integrated MOS capacitors; and the circuit is integrated on a single chip. The circuit uses no external capacitor.

The analog receiver includes a direct conversion receiver.

In one embodiment of the invention, a process includes combining an analog feedback signal and an analog input to generate an analog signal; processing the analog signal to generate a digital signal; and processing the digital signal to generate the analog feedback signal.

The process further includes generating the analog input from a direct conversion receiver. The analog feedback signal cancels a direct current (DC) offset in the analog input.

The processing the analog signal includes amplifying the analog signal; and digitizing the amplified analog signal. The amplifying process includes filtering the analog signal.

The processing the digital signal includes filtering the digital signal; converting the filtered digital signal to the analog feedback signal.

The filtering the digital signal includes accumulating the digital signal with a delayed version of the digital signal.

The converting the filtered digital signal includes low pass filtering an analog signal converted from the filtered digital signal.

The process of combining includes subtracting the analog feedback signal from the analog input to generate the analog signal.

In one embodiment of the invention, a circuit includes means for combining an analog feedback signal and an analog input to generate an analog signal; means for processing the analog signal to generate a digital signal; and means for processing the digital signal to generate the analog feedback signal.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION OF THE FIGURES

The following description and drawings are illustrative of the invention and are not to be construed as limiting the invention. Numerous specific details are described to provide a thorough understanding of the present invention. However, in certain instances, well-known or conventional details are not described in order to avoid obscuring the description of the present invention. References to one or an embodiment in the present disclosure are not necessarily references to the same embodiment; and, such references mean at least one.

Direct conversion is a receiver solution that has significant advantages such as reduced components and thus reduced cost. However, a direct conversion receiver may generate direct current (DC) offset at the output of the down-conversion mixers. The DC offset will saturate the subsequent stages of amplification and degrade the available dynamic range of the receiver.

To cancel the DC offset, a traditional approach uses an analog integrator to provide a feedback. The analog integrator needs a large integration capacitor which is typically implemented as a discrete external component. The use of the external capacitor in the transitional approach increases the pin count of the receiver chip, the number of external components and hence the printed circuit board area of the system. In addition, the external capacitor may pick up noise and require shielding.

One embodiment of the invention seeks to eliminate the use of external components, such as the external integration capacitor in the circuitry for direct current (DC) offset cancellation in a direct conversion receiver.

It is difficult to integrate such a large integration capacitor on an integrate circuit chip. When such a large capacitor was implemented using a high-density integrated MOS capacitors (e.g., using the currently available technologies), an implementation of the capacitor would consume too large a die area. Further, the large integrated MOS capacitor would be lossy due to leakage current, especially when implemented using a deep sub-micron process. When implemented using a deep sub-micron process, the leakage current of such a capacitor can be large enough to affect the function of the integrator. Such a lossy capacitor would not function well as an integration capacitor in an analog integrator, since the leakage current would become to an additional significant source of DC offset for the direct conversion receiver.

One embodiment of the invention integrates a DC offset cancellation loop into the direct conversion receiver to cancel the DC offset using a digital technique. For example, at least the integration portion of the DC offset cancellation loop is implemented using a digital technique to eliminate the use of an analog integration capacitor.

For example, the analog signal can be converted into the digital domain. After processing the digital signal, the cancellation loop provides an appropriate analog feedback signal, based on the digital processing, to cancel the offset.

In one embodiment of the invention, the size of the capacitors used in the DC offset cancellation loop is reduced (e.g., to below 1 nH) such that the capacitors used in the DC offset cancellation loop can be implemented on an integrated circuitry chip (e.g., as high density integrated MOS capacitors using a deep sub-micron process). Thus, without the use of an external integration capacitor, a direct conversion receiver can be integrated with a digital signal processor (DSP) for direct current (DC) offset cancellation on a single chip, which can be implemented using deep sub-micron processes (e.g., having a feature size smaller than 0.5 micron).

Figure 1:
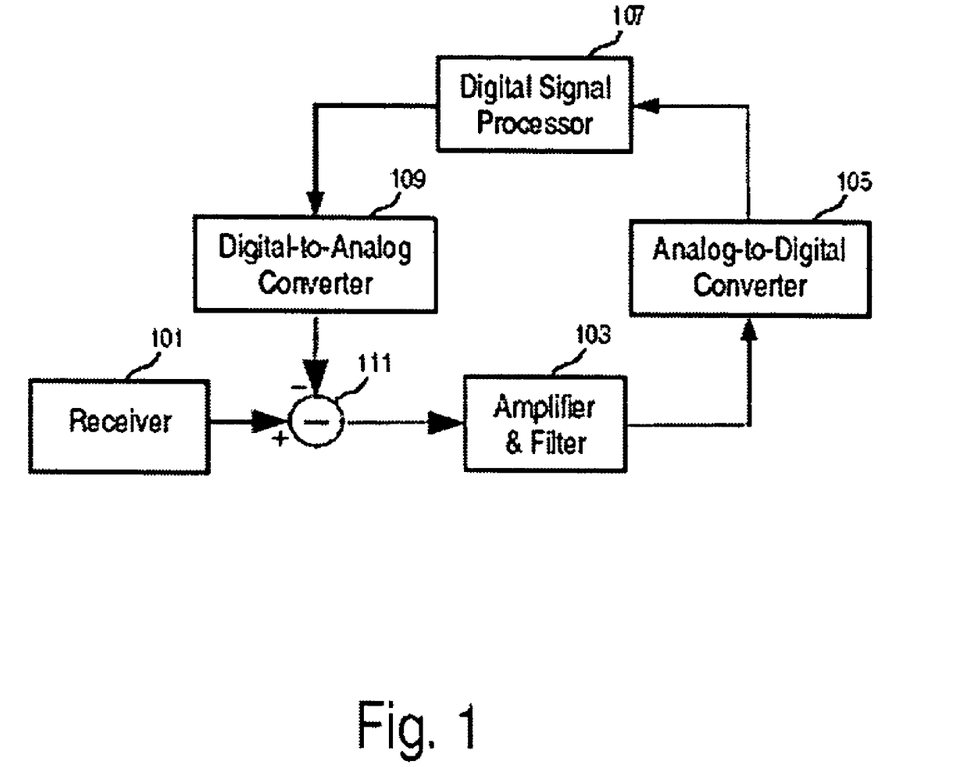
FIG. 1 shows a block diagram of a circuit to provide analog feedback according to one embodiment of the invention.

FIG. 1 shows a block diagram of a circuit to provide analog feedback according to one embodiment of the invention. In FIG. 1, a receiver (101) generates an output which is combined (111) with the feedback from digital-to-analog converter (109). The combined signal is processed by the amplifier and filter (103) to generate an analog output signal. An analog-to-digital converter (105) converts the analog output signal into a digital signal, which is processed by a digital signal processor (107) to provide a digital feedback signal. The digital feedback signal is converted back to the analog domain by the digital-to-analog converter (109) to provide the analog feedback signal that is combined (111) with the output of the receiver (101).

For example, when implementing a direct conversion receiver, the receiver (101) may provide the output signal from a mixer, which may produce a direct current (DC) offset. To suppress the DC offset, the digital signal processor (DSP) (107) can be designed to determine a feedback signal. Since the feedback signal is determined in the digital domain, the external integration capacitor of a traditional feedback loop can be eliminated. The feedback signal is applied to the input end of the amplifier and filter to suppress the DC offset produced by the mixer to improve the sensitivity and dynamic range of the system.

Figure 2:
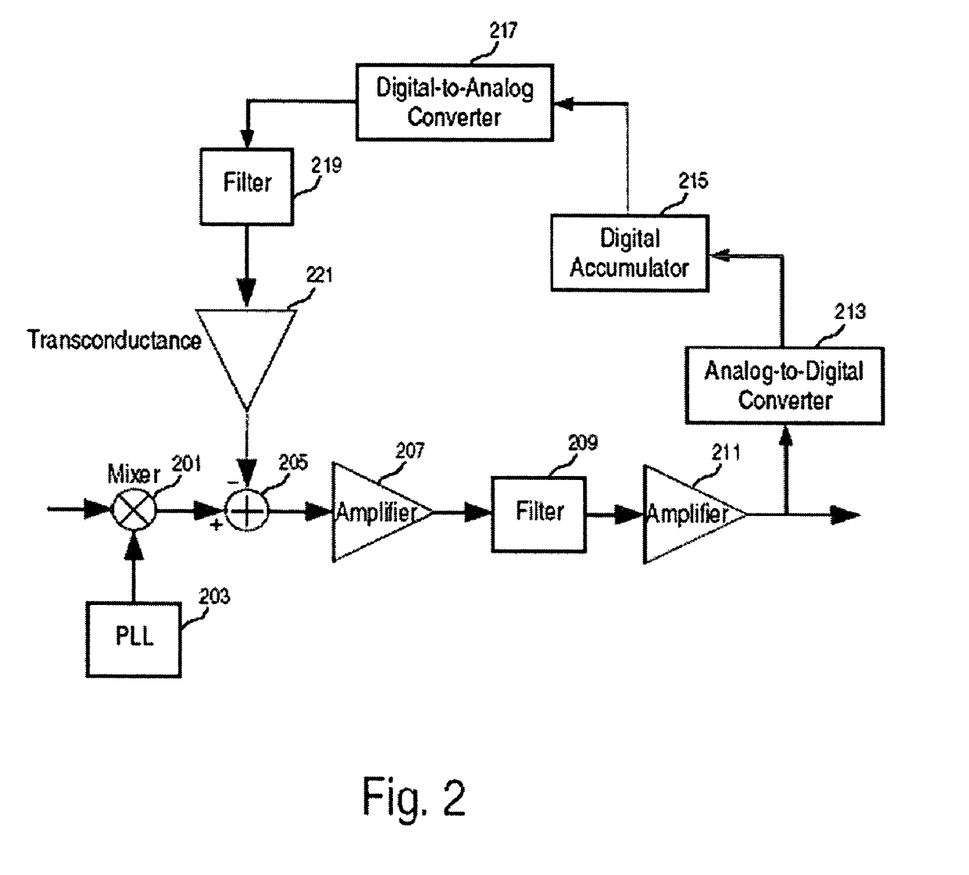
FIG. 2 shows a block diagram of a direct conversion receiver with a direct current (DC) offset cancellation loop according to one embodiment of the invention.

FIG. 2 shows a block diagram of a direct conversion receiver with a direct current (DC) offset cancellation loop according to one embodiment of the invention.

In FIG. 2, the phase lock loop (203) provides a local reference signal which is tuned to the same frequency as the carrier of a desired channel. The mixer (201) demodulates the signal modulated on the carrier of the desired channel. A filter (209) is used to reject the signals modulated on the carriers of other channels. Amplifiers (207 and 211) can be used before and/or after the filter (209). The filter and the amplifiers may share a portion of circuitry.

In FIG. 2, a direct current (DC) offset cancellation loop includes: an analog-to-digital converter (ADC) (213), a digital accumulator (215), a digital-to-analog converter (DAC) (217), a filter (219), and a summing amplifier (205) with a transconductance (221).

In FIG. 2, the analog-to-digital converter (ADC) (213) is used so that the direct current (DC) offset can be measured digitally. The analog-to-digital converter (ADC) (213) may be a sigma-delta analog-to-digital converter (ADC) or other types of analog-to-digital converter (ADC). The output of the ADC is integrated using the digital accumulator (215) for DC offset cancellation.

The output of the digital accumulator (215) drives a digital-to-analog converter (DAC) (217). For example, the digital-to-analog converter DAC may be designed to have a resolution higher than 15 bits. The digital-to-analog converter (DAC) (217) may be a sigma delta digital-to-analog converter (DAC) or other types of high-resolution digital-to-analog converter (DAC).

The digital-to-analog converter (DAC) (217) uses a loop filter (219) at its output. The filter (219) may be passive or active. The output of the loop filter is then used to cancel the direct current (DC) offset.

In FIG. 2, the transconductance (221) of a summing amplifier (205) is used to subtract the output of the DC offset loop from the output of the mixer (201). Other means for subtracting the output signal of the DC offset loop from the output of the mixer (201) can also be used.

Figure 3:
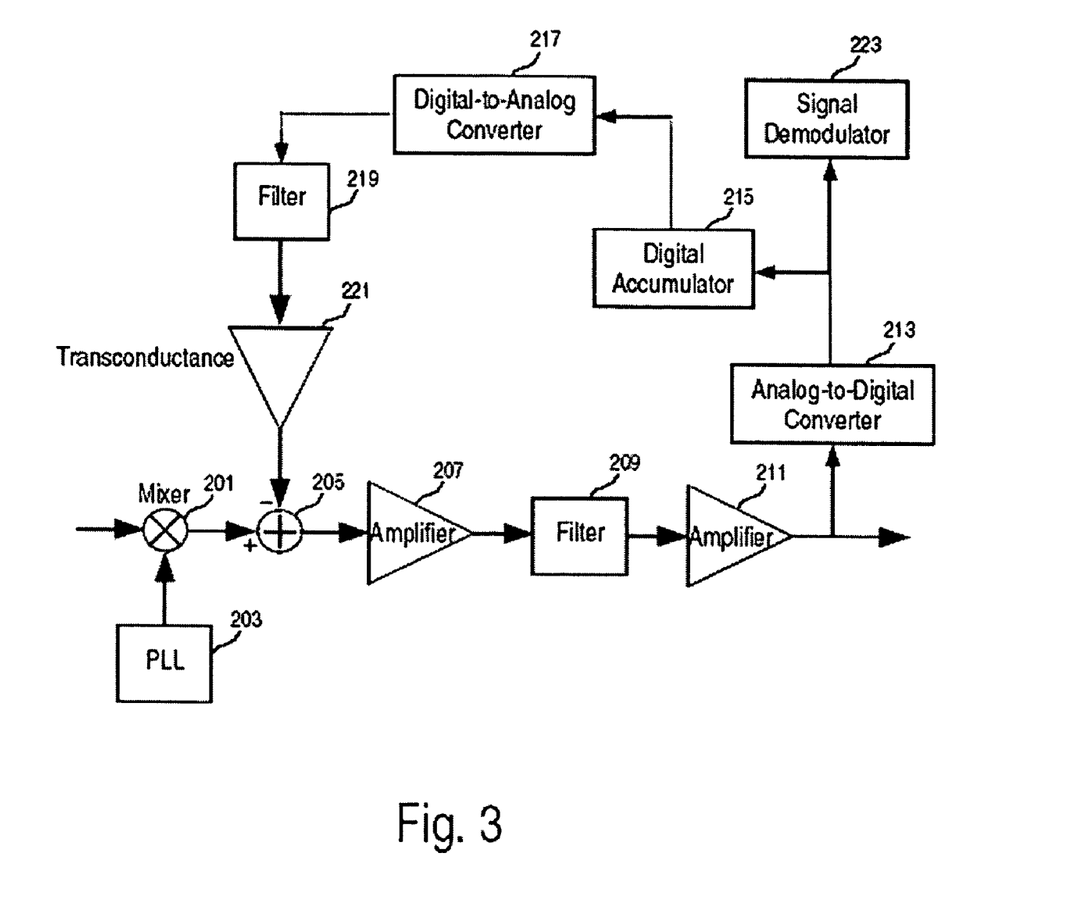
FIG. 3 shows another block diagram of a direct conversion receiver with a direct current (DC) offset cancellation loop according to one embodiment of the invention.

In one embodiment, the output of the analog-to-digital converter can also be used for other digital signal processing, such as for demodulation, filtering, enhancement, etc., as illustrated in FIG. 3.

Figure 4:
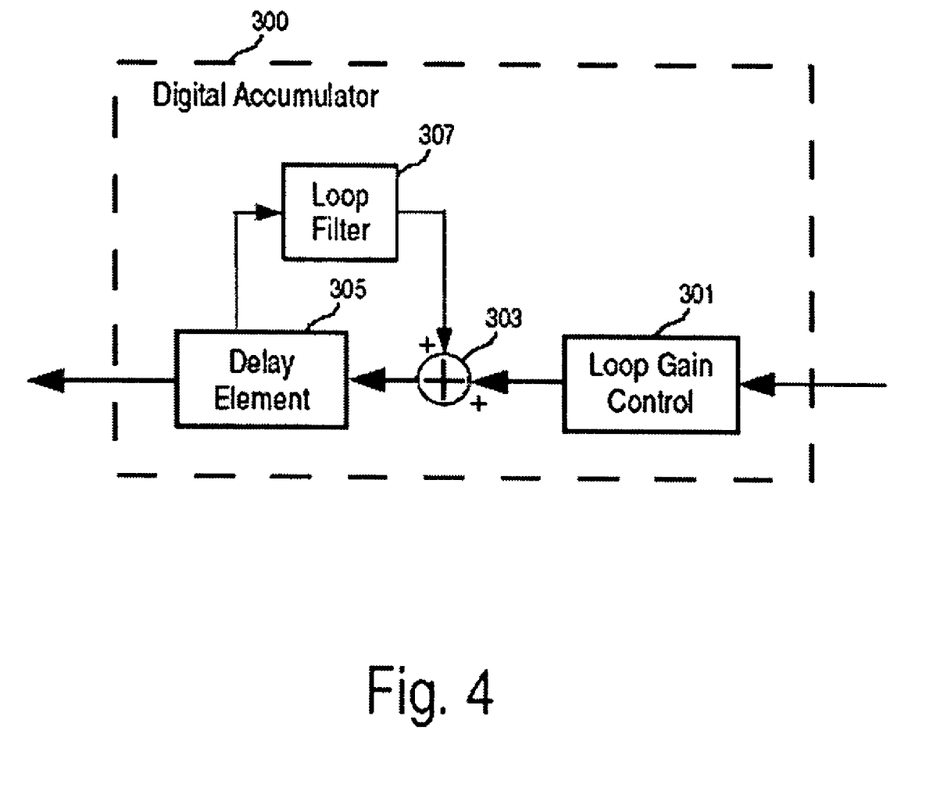
FIG. 4 shows a digital accumulator which can be used in embodiments of the invention.

FIG. 4 shows a digital accumulator which can be used in embodiments of the invention. In FIG. 4, the digital accumulator (300) may include a loop gain control (301), an adder (303), a delay element (305) and a loop filter (307).

The loop gain control (301) allows the tuning of the overall gain of the digital accumulator and thus the gain of the DC cancellation loop. The loop gain control (301) provides the control in the digital domain. Alternatively, or in combination, an analog loop gain control may be used in a DC cancellation loop.

In one embodiment, the digital loop gain control (301) may be implemented with dynamically changing gain to shorten the settling time. The digital accumulator may use the loop filter (307) to implement for certain filtering actions digitally, such as removing noise, or allowing for certain transfer functions such as the addition of poles or/and zeros for compensation purpose.

Since the accumulator is implemented in the digital domain, the use of a large external integration capacitor as required in an analog integrator can be eliminated.

In one embodiment, the use of the digital accumulator allows the use of a capacitor below 1 nH in the filter (e.g., 219) that follows the digital-to-analog converter (e.g., 217). Thus, the direct conversion receiver and the DC cancellation loop can be implemented using a deep sub-micron technique, which allows for using the use of high-density integrated MOS capacitors for the output of the DAC, instead of external capacitors.

Figure 5:
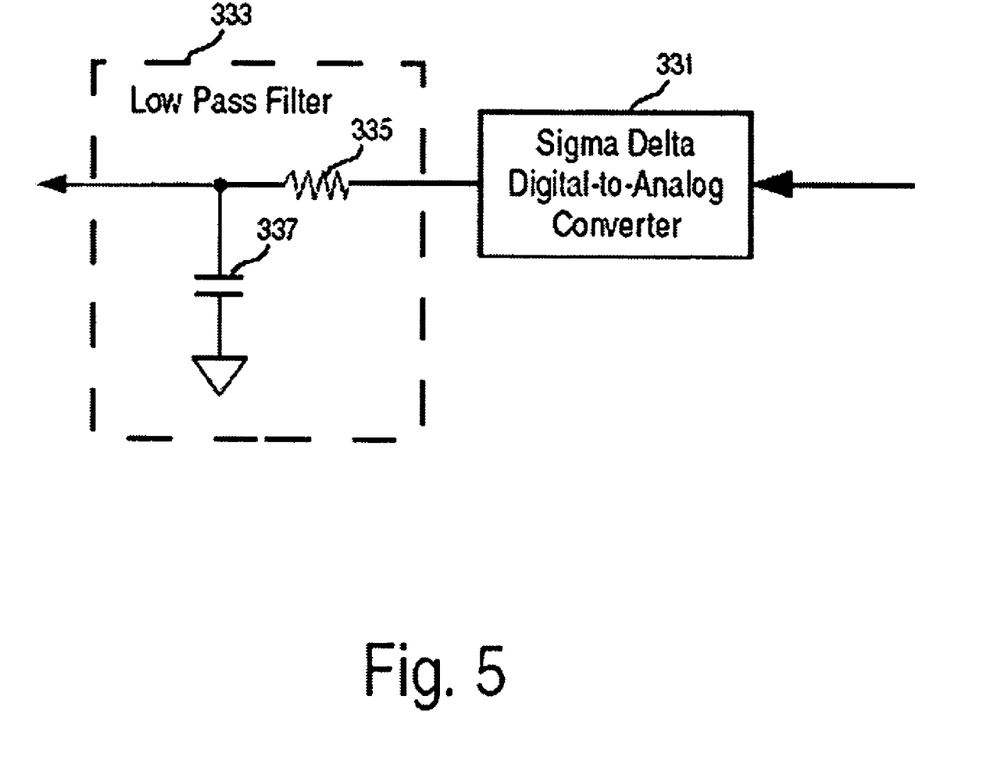
FIG. 5 shows a circuit to convert a digital feedback signal into an analog feedback signal according to one embodiment of the invention.

FIG. 5 shows a circuit to convert a digital feedback signal into an analog feedback signal according to one embodiment of the invention. In FIG. 5, a sigma-delta digital-to-analog converter (331) converts the digital feedback signal into an analog signal, which is filtered with a low pass filter (333), including a resistor (335) and a capacitor (337). Since the integration is carried out using the digital circuitry (e.g., the digital accumulator 300 illustrated in FIG. 4), the capacitor (337) used in the low pass filter (333) has a size much smaller than that would be required in an analog integrator. The capacitor (337) of the low pass filter (333) can be implemented using high-density integrated MOS capacitors and can be implemented using a deep sub-micron semiconductor manufacturing process.

Figure 6:
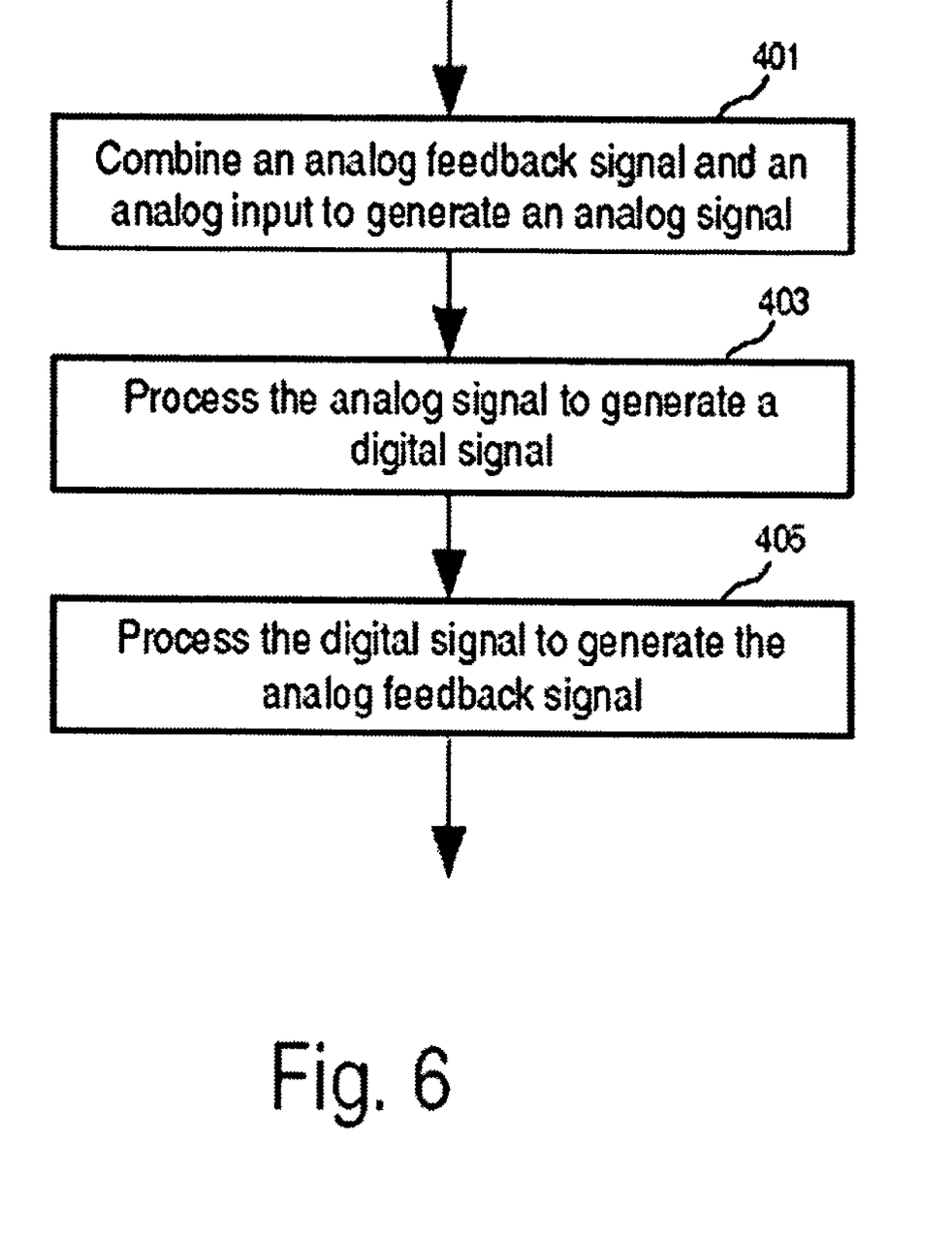
FIG. 6 shows a flow diagram of a process to provide analog feedback according to one embodiment of the invention.

FIG. 6 shows a flow diagram of a process to provide analog feedback according to one embodiment of the invention. In FIG. 6, an analog feedback signal and an analog input are combined (401) to generate an analog signal. The analog signal is processed (403) to generate a digital signal. The digital signal is processed (405) to generate the analog feedback signal, which is combined with the analog input to generate the analog signal.

In FIG. 6, the digital signal may be processed to determine the direct current (DC) offset in the analog signal to cancel DC offset in the analog input, which may be generated from the mixer of a direct conversion receiver.

The digital processing may be implemented using a hardware circuitry, or partially in hardware and partially in software (or firmware), or in software (or firmware).

Figure 7:
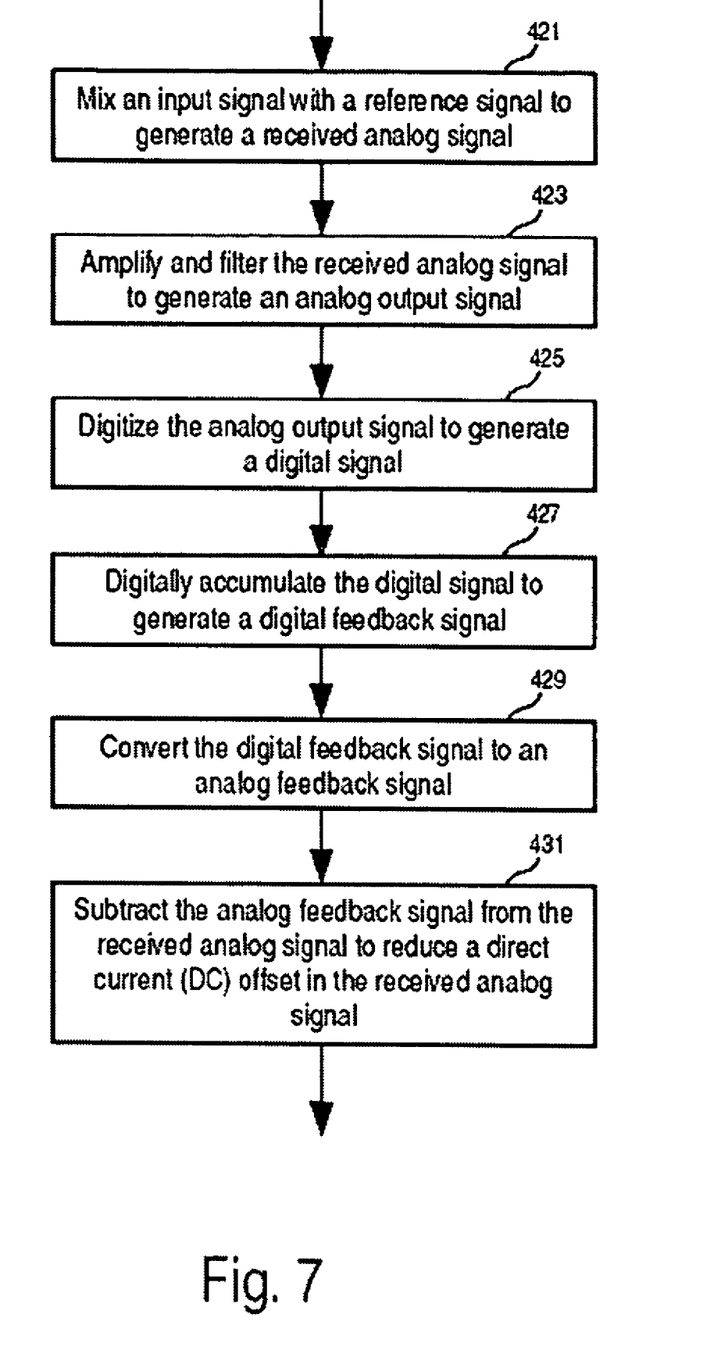
FIG. 7 shows an example of a process to provide analog feedback according to one embodiment of the invention.

FIG. 7 shows an example of a process to provide analog feedback according to one embodiment of the invention. In FIG. 7, an input signal is mixed (421) with a reference signal to generate a received analog signal. The received analog signal amplified and filtered (423) to generate an analog output signal. The analog output signal is digitized (425) to generate a digital signal. The digital signal is digitally accumulated (427) to generate a digital feedback signal. The digital feedback signal is converted (429) to an analog feedback signal. The analog feedback signal is subtracted (431) from the received analog signal to reduce a direct current (DC) offset in the received analog signal.

A direct conversion receiver with a digital signal processor (DSP)-based direct current (DC) offset cancellation loop can be integrated onto a single silicon semi-conductive substrate chip with a deep sub-micron feature size. A digital signal processor is used to determined and cancel the DC offset in the analog portion of the receiver. Such a direct conversion receiver can be used in advanced satellite communication receiver chips, in Digital Video Broadcasting via satellite (DVB-S or DVB-S2) receivers, Digital Video Broadcasting for Handhelds (DVB-H) receivers, and Digital Video Broadcasting via terrestrial (DVB-T) receivers. It may also be used in other receivers/transceivers in applications including, but not limited to, wireless local area network (LAN) transceivers, Global System for Mobile Communications (GSM) transceivers, etc.

In one embodiment of the present invention, a DC offset cancellation loop is integrated with the direct current receiver on a chip, using deep sub-micron processes, after eliminating the large external capacitor for DC offset cancellation through the use of a digital accumulator, thus decreasing the pin count of the receiver and reducing the board space usage and the cost of the system. Further, the digital accumulator allows to dynamically tune the digital loop gain and fast settling time.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A circuit, comprising:
    an analog receiver; and
    a feedback circuit comprising
        an analog-to-digital converter coupled with the analog receiver to digitize an analog signal of the analog receiver;
        a digital signal processor coupled with the analog-to-digital converter to generate a feedback signal to the analog
    receiver, wherein the digital signal processor comprises a digital accumulator, and the digital accumulator comprises:
        an adder;
        a delay element coupled to an output of the adder; and
        a digital loop filter coupled from an output of the delay element to an input of the adder; and
    a digital-to-analog converter coupled with the digital signal processor to provide the feedback signal to the analog receiver, wherein the feedback signal reduces a direct current (DC) offset in the analog receiver.

2. The circuit of claim 1, wherein the digital-to-analog converter comprises a sigma delta digital-to-analog converter.

3. The circuit of claim 1, wherein the digital accumulator further comprises:
    a gain controller coupled with the adder.

4. The circuit of claim 1, wherein the feedback circuit further comprises:
a low pass filter coupled with the digital-to-analog converter to generate the feedback signal.

5. The circuit of claim 4, wherein the low pass filter is implemented using integrated MOS capacitors; and the circuit is integrated on a single chip.

6. The circuit of claim 5, wherein the circuit uses no external capacitor.

7. The circuit of claim 1, wherein the analog receiver comprises a direct conversion receiver.

8. The circuit of claim 1, wherein the analog receiver comprises a filter to reject signals modulated on carriers of channels other than a desired channel.

9. The circuit of claim 1, wherein the feedback circuit further comprises a transconductance to generate the feedback signal.

10. The circuit of claim 4, wherein the low pass filter comprises an integrated MOS capacitor.

* * * * *